United States Patent
Okada et al.

(10) Patent No.: US 11,112,086 B2
(45) Date of Patent: Sep. 7, 2021

(54) PHOSPHOR ELEMENT AND LIGHTING DEVICE

(71) Applicant: NGK INSULATORS, LTD., Nagoya (JP)

(72) Inventors: Naotake Okada, Anjo (JP); Iwao Ohwada, Nagoya (JP); Shoichiro Yamaguchi, Ichinomiya (JP); Keiichiro Asai, Nagoya (JP); Jungo Kondo, Miyoshi (JP)

(73) Assignee: NGK INSULATORS, LTD., Nagoya (JP)

( * ) Notice: Subject to any disclaimer, the term of this patent is extended or adjusted under 35 U.S.C. 154(b) by 163 days.

(21) Appl. No.: 16/217,851

(22) Filed: Dec. 12, 2018

(65) Prior Publication Data

US 2019/0120442 A1    Apr. 25, 2019

Related U.S. Application Data

(63) Continuation of application No. PCT/JP2017/022105, filed on Jun. 15, 2017.

(30) Foreign Application Priority Data

Jun. 16, 2016 (JP) .............................. JP2016-119981
Aug. 8, 2016 (JP) .............................. JP2016-155437

(51) Int. Cl.
*H01L 33/50* (2010.01)
*F21V 7/30* (2018.01)
(Continued)

(52) U.S. Cl.
CPC ................ *F21V 7/30* (2018.02); *C09K 11/00* (2013.01); *F21K 9/64* (2016.08); *F21V 13/08* (2013.01);
(Continued)

(58) Field of Classification Search
CPC ..................................................... H01L 33/507
See application file for complete search history.

(56) References Cited

U.S. PATENT DOCUMENTS 8,556,437 B2   10/2013   Miyake
8,916,399 B2   12/2014   Ichikawa
(Continued)

FOREIGN PATENT DOCUMENTS

JP   2000-208257 A   7/2000
JP   2011-107508 A   6/2011
(Continued)

OTHER PUBLICATIONS

International Preliminary Report on Patentability for PCT/JP2017/022105, dated Dec. 18, 2018 (1 pg.).
(Continued)

*Primary Examiner* — Sean P Gramling
(74) *Attorney, Agent, or Firm* — Flynn Thiel, P.C.

(57) ABSTRACT

A phosphor device includes a phosphor layer composed of a phosphor glass or phosphor single crystal, a reflective film provided on the phosphor layer, a warping suppression layer provided on the reflective film, and a supporting body bonded to the warping suppression layer by direct bonding. An excitation light incident into the phosphor layer is converted to fluorescence, and the fluorescence and excitation light are reflected by the reflective film and emitted from the phosphor layer.

5 Claims, 7 Drawing Sheets

(51) Int. Cl.
*G02B 5/28* (2006.01)
*G02B 5/26* (2006.01)
*C09K 11/00* (2006.01)
*G02B 5/08* (2006.01)
*G02B 5/20* (2006.01)
*F21V 13/08* (2006.01)
*F21K 9/64* (2016.01)
*F21Y 115/30* (2016.01)

(52) U.S. Cl.
CPC ............... *G02B 5/08* (2013.01); *G02B 5/20* (2013.01); *G02B 5/26* (2013.01); *G02B 5/28* (2013.01); *H01L 33/507* (2013.01); *F21Y 2115/30* (2016.08)

(56) References Cited

U.S. PATENT DOCUMENTS

| | | | |
|---|---|---|---|
| 9,897,286 B2 | 2/2018 | Yamanaka et al. | |
| 2016/0040857 A1* | 2/2016 | Inoue | F21V 9/32 362/343 |
| 2016/0043289 A1 | 2/2016 | Inomata et al. | |

FOREIGN PATENT DOCUMENTS

| | | |
|---|---|---|
| JP | 2012-129135 A | 7/2012 |
| JP | 2012-185980 A | 9/2012 |
| JP | 2013-120713 A | 6/2013 |
| JP | 5530165 B2 | 6/2014 |
| JP | 5620562 B1 | 11/2014 |
| JP | 2016-066764 A | 4/2016 |
| WO | WO 2011/126000 A1 | 10/2011 |
| WO | WO 2013/024558 A1 | 2/2013 |
| WO | WO 2015/045976 A1 | 4/2015 |
| WO | WO 2016/167071 A1 | 10/2016 |

OTHER PUBLICATIONS

English translation of Written Opinion of the International Searching Authority for PCT/JP2017/022105, dated Sep. 12, 2017 (8 pgs.).
Japanese International Search Report and Written Opinion for corresponding PCT/JP2017/022105, dated Sep. 12, 2017 (7 pgs).
English International Search Report for corresponding PCT/JP2017/022105, dated Sep. 12, 2017 (2 pgs).

* cited by examiner

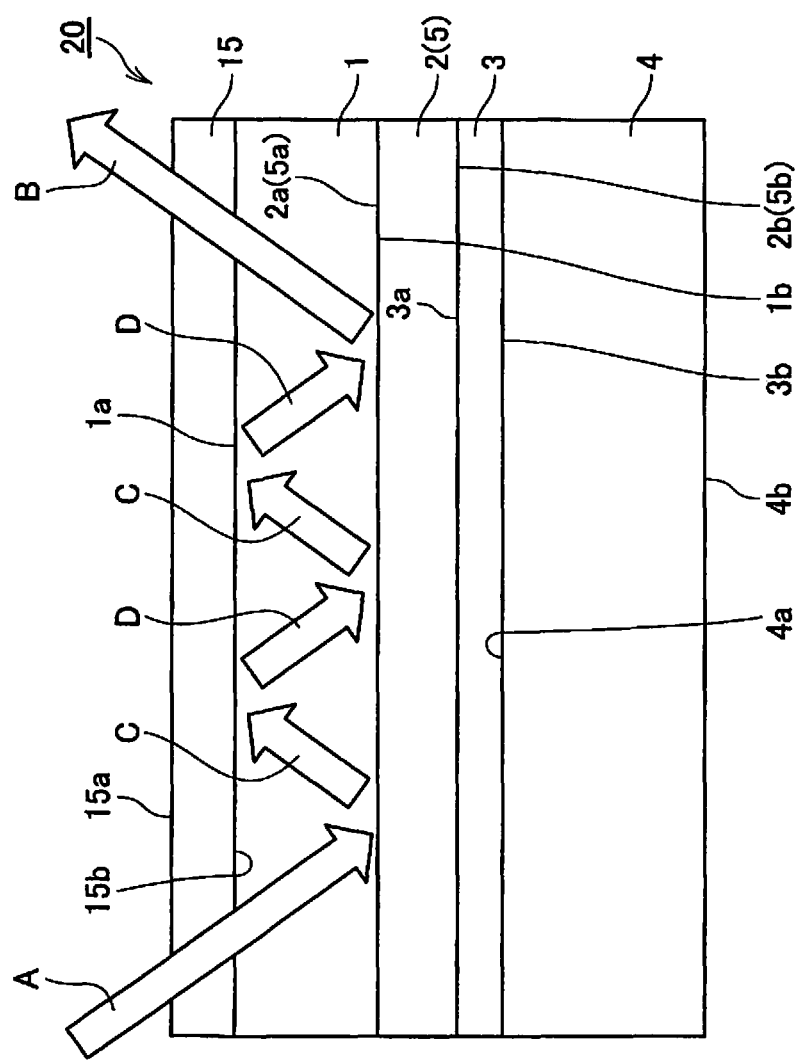

PHOSPHOR ELEMENT AND LIGHTING DEVICE

CROSS-REFERENCE TO RELATED APPLICATIONS

This is a continuation of PCT/JP2017/022105, filed Jun. 15, 2017, which claims priority to Japanese Application Nos. 2016-119981, filed Jun. 16, 2016 and 2016-155437, filed Aug. 8, 2016, the entire contents of which are hereby incorporated by reference.

TECHNICAL FIELD

The present invention relates to a phosphor device and lighting apparatus emitting fluorescence.

BACKGROUND ARTS

Recently, intensive study has been undertaken of headlights for a vehicle employing a laser light source, and one type of laser light source is a white light source constructed by combining blue laser or ultraviolet laser and a phosphor. A light density of an excitation light can be increased by condensing laser light, and, moreover, a light intensity of the excitation light can also be increased by condensing multiple beams of laser light so as to overlap on the phosphor. As a result, light flux and brightness can simultaneously be increased without changing a light emission area. Therefore, a white light source that combines semiconductor laser and a phosphor with each other is attracting attention as a light source that replaces the LED. For example, as phosphor glass used for the vehicle headlight, phosphor glass "Lumiphous™" from Nippon Electric Glass and YAG monocrystalline phosphors from National Institute for Materials Science, Tamura Corporation, and Koha Co. Ltd. are proposed.

According to patent document 1, by providing monocrystalline YAG, the conversion efficiency is not deteriorated even with an increase of temperature to exhibit phosphor characteristics with a high efficiency, so that applications requiring a high power can be realized. By inputting a blue light of 450 nm as an excitation light, this material can emit a yellow light as the complementary color, so that a white light can be obtained. Thus, the development of an application to a projector or head light has been studied.

As a phosphor for illumination, a Ce:YAG monocrystalline phosphor in which Ce is doped into yttrium aluminum garnet ($Y_3Al_5O_{12}$:YAG) has been developed. In prior arts, the Ce-YAG phosphor has been synthesized by sintering or dispersion in a glass. As a power density of the excitation light is raised, the heat dissipation becomes difficult to reduce the efficiency which is problematic.

Monocrystalline YAG doped with Ce has the characteristic that the conversion efficiency is not deteriorated in spite of heat generation in the crystal. It is thus expected to be used as a light source for a head light, projector or the like.

According to patent documents 2, 3 and 4, a lighting apparatus using a reflection type phosphor device is disclosed. According to the device, a metal film is formed on a surface of a phosphor layer on the side opposite to an incident surface to which an excitation light is made incident, and the metal film is bonded to a heat dissipating body (supporting body). As a material of the phosphor layer, a glass material with a phsophor dispersed therein, a polycrystaliline phosphor or a monocrystalline phosphor is listed.

According to patent document 5, a lighting apparatus including a reflection type phosphor device is disclosed.

According to this system, a ferroelectric multi-layered film is formed on a surface of the phosphor layer on the opposite side to an incident surface to which an excitation light is incident, and the ferroelectric multi-layered film and heat dissipating body (supporting body) are bonded with each other. The ferroelectric multi-layered film transmits the excitation light and reflects the fluorescence emitted by the phosphor layer. The ferroelectric multi-layered film is formed by alternately laminating low refractive index layers and high refractive index layers.

CITATION LIST

Patent Document

PATENT DOCUMENT 1: JP 5620562B
PATENT DOCUMENT 2: JP 5530165B
PATENT DOCUMENT 3: JP 2012-129135A
PATENT DOCUMENT 4: JP 2013-120713A
PATENT DOCUMENT 5 WO 2015/045976 A1
PATENT DOCUMENT 6 WO 2016/167071 A1

SUMMARY OF THE INVENTION

Further, the applicant proposed a waveguide type phosphor device utilizing a phosphor single crystal (Patent document 6). It is, however, to convert light propagating in an optical waveguide to fluorescence.

Based on the teachings of patent documents 3 to 5, the inventors tried to form a reflective film on a phosphor layer and to bond the reflective film to a separate supporting body by direct bonding. However, uniform bonding could not be provided over the whole of the bonding interface of the reflective film and supporting body and bubbles may be generated. Further, when an excitation light is irradiated onto the phosphor layer after the reflective film and supporting body are bonded with each other, the intensity of the fluorescence emitted from the phosphor device may be deteriorated. Further, as the in-plane deviation was observed in this phenomenon in the phosphor layer, it has been proven that color deviation occurs in the emitted fluorescence.

An object of the present invention is, in a phosphor device including a phosphor layer made of a phosphor glass or phosphor single crystal, a reflective film provided on the phosphor layer and a supporting body to improve the bonding condition of the reflective film and supporting body and to improve the intensity of the fluorescence emitted from the phosphor device.

The present invention provides a phosphor device comprising:
a phosphor layer;
a reflective film provided on the phosphor layer;
a warping suppression layer provided on the reflective film; and
a supporting body bonded to said warping suppression layer by direct bonding,
wherein an excitation light incident onto the phosphor layer is converted to a fluorescence and
wherein the fluorescence and excitation light are reflected by the reflective film and emitted from the phosphor layer.

The inventors studied the cause of bubbles generated at the bonding surface of the supporting body and reduction of the intensity of the fluorescence reflected by the device when the reflective film is formed on the phosphor layer and the reflective film is bonded to the separate supporting body by direct bonding. The inventors then found the following.

For example, when the reflective layer is a ferroelectric multi-layered film, the ferroelectric film is formed only on a first main surface of the phosphor layer. When the temperature is raised during the film formation, warping occurs due to the difference of thermal expansion coefficients of the phosphor layer and ferroelectric multi-layered film when the temperature is brought back to an ambient temperature after the film formation. By this, when the phosphor layer and supporting body are bonded by direct bonding, the direct bonding with the supporting body cannot be made uniform over the whole surface due to the warping. Bubbles may be generated in regions where the bonding is not formed. Furthermore, it has been found that the conversion efficiency is deteriorated due to the effect of an internal stress left in the phosphor layer and the intensity of the fluorescence is thereby lowered.

Similar to this, when the reflective film is composed of a metal film, the metal film is formed only on the first main surface of the phosphor layer. When the temperature is raised during the film formation, warping occurs due to the difference of thermal expansion coefficients of the phosphor layer and metal film when the temperature is brought back to an ambient temperature after the film formation. However, the direction of the thus generated warping was opposite to the direction of the warping generated when forming the ferroelectric multi-layered film. By this, when that the phosphor layer and supporting body are bonded by direct bonding, the direct bonding with the supporting body cannot be made uniform over the whole surface due to the warping. Bubbles may be generated in regions where the bonding is not formed. Furthermore, it has been found that the conversion efficiency is deteriorated due to the effect of an internal stress left in the phosphor layer and the intensity of the fluorescence is thereby lowered.

The present inventors then tried to form a reflective film on the phosphor layer and a warping suppression layer on the reflective film so that the warping of the phosphor layer is reduced and the phosphor layer is bonded to the supporting body by direct bonding. As a result, it has been found that the generation of bubbles at the bonding interface to the supporting body can be suppressed, the deterioration of the conversion efficiency due to stress can be prevented, and the intensity of the fluorescence reflected by the device is improved. The present invention is thus made.

BRIEF DESCRIPTION OF THE DRAWINGS

FIG. 7 is a diagram schematically showing a device 20 according to still another embodiment of the present invention, in which a partial transmission film 15 is provided on the phosphor layer 1.

EMBODIMENTS FOR CARRYING OUT THE INVENTION

Figure 1:
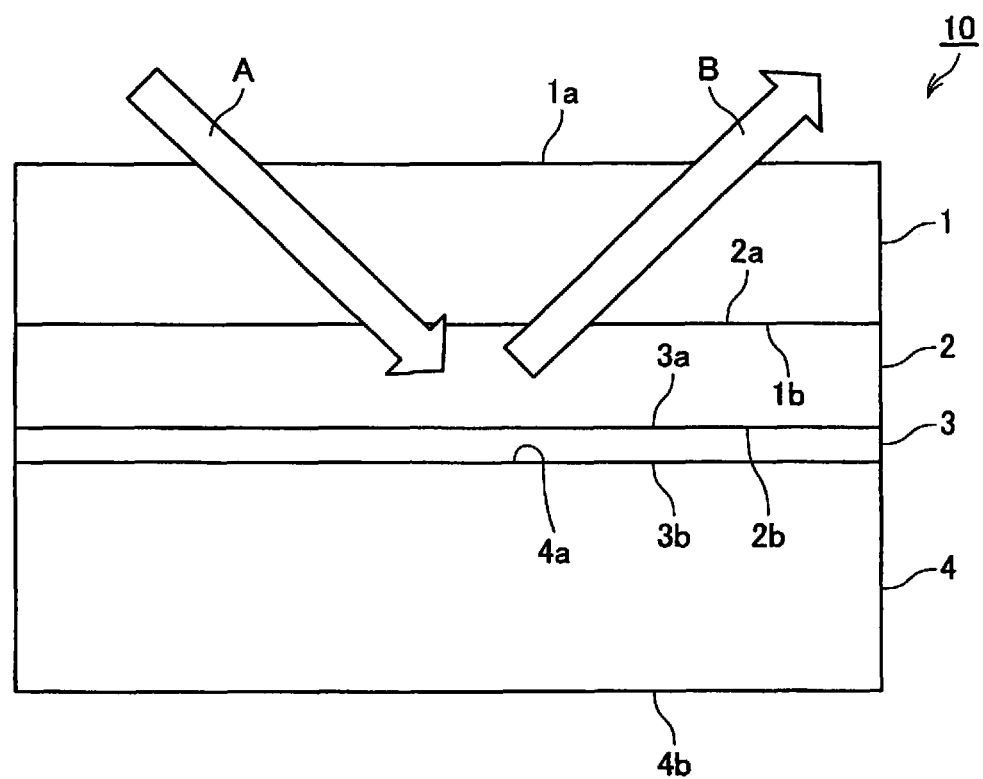
FIG. 1 is a diagram schematically showing a phosphor device 10 according to an embodiment of the present invention.

FIG. 1 is a diagram schematically showing a phosphor device 10 according to an embodiment of the present invention.

In the phosphor device 10, a ferroelectric multi-layered film 2 is provided on a main surface 1b of a phosphor layer 1, and a warping suppression layer 3 is provided on a main surface 2b of the ferroelectric multi-layered film 2. A main surface 3b of the warping suppression layer 3 is bonded to a main surface 4a of a supporting body 4 by direct bonding. 4b represents a bottom surface of the supporting body 4. 2a represents a main surface of the ferroelectric multi-layered film 2, and 3a represents a main surface of the warping suppression layer 3.

When an excitation light A is incident onto the main surface 1a of the phosphor layer 1, a part of the excitation light is converted to fluorescence, which is made incident onto the ferroelectric multi-layered film 2 through the main surface 2a. The remaining excitation light and fluorescence are reflected in the ferroelectric multi-layered film 2, pass through the phosphor layer 1 again as shown an arrow B, and are emitted from the main surface 1a.

Figure 2:
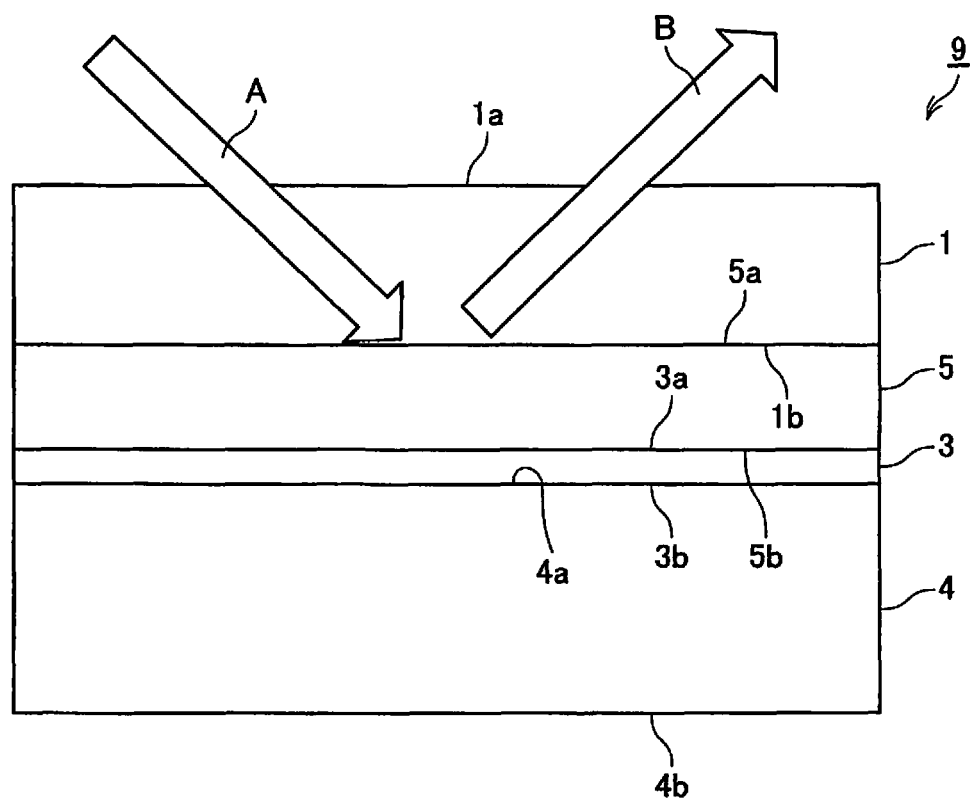
FIG. 2 is a diagram schematically showing a phosphor device 9 according to another embodiment of the present invention.

FIG. 2 is a diagram schematically showing a phosphor device 9 according to another embodiment of the present invention.

In the phosphor device 9, a metal film 5 is provided on a main surface 1b of a phosphor layer 1, and a warping suppression layer 3 is provided on a main surface 5b of the metal film 5. The main surface 3b of the warping suppression layer 3 is bonded to a main surface 4a of a supporting body 4 be direct bonding. 4b represents a bottom surface of the supporting body 4. 5a represents the main surface of the metal film 5, and 3a represents the main surface of the warping suppression layer 3.

When an excitation light A is incident onto the main surface 1a of the phosphor layer 1, a part of the excitation light A is converted to fluorescence. The excitation light and fluorescence are reflected by the main surface 5a of the metal film 5, pass through the phosphor layer 1 again as an arrow B, and are emitted from the main surface 1a.

The effect of the present invention will be further described in detail below.

For example, as shown in FIG. 3, the present inventors tried to form a ferroelectric multi-layered film 2A on a phosphor layer 1A and bond the ferroelectric multi-layered film 2A to a separate supporting body 4 by direct bonding. The inventors then studied the cause of the bubbles generated at the bonding surface 4a of the supporting body 4 and the intensity of the fluorescence reflected by the device being lowered. The following findings were obtained.

Figure 3A:
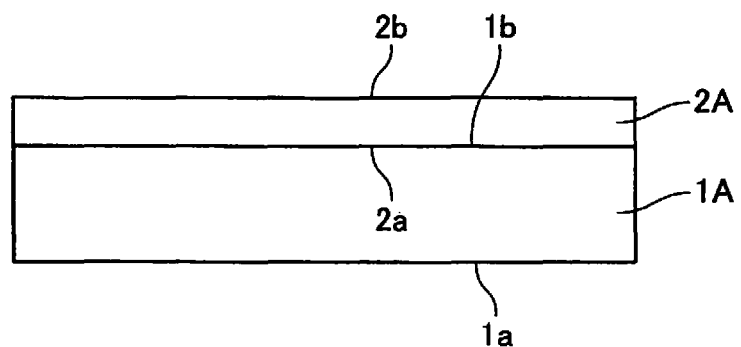
FIG. 3(a) shows the state that a ferroelectric multi-layered film 2A is formed on a phosphor layer 1A.
Figure 3B:
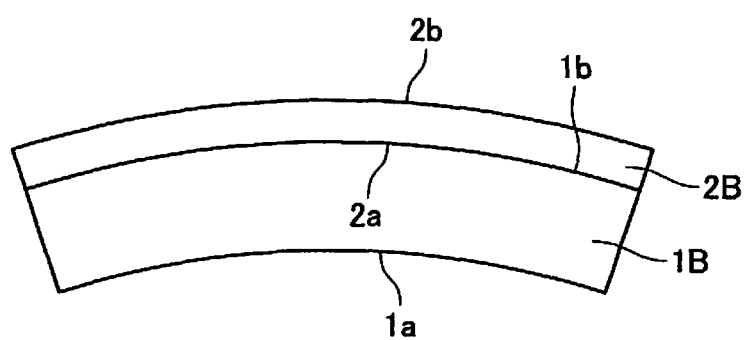
FIG. 3(b) shows the state after the phosphor layer of FIG. 3(a) is cooled.

When the reflective film is the ferroelectric multi-layered film 2A, the ferroelectric multi-layered film 2A is formed only on the first main surface 1b of the phosphor layer 1. Even when the laminate is flat during the film-formation step (at a high temperature) as shown in FIG. 3(a), warping occurred due to the difference of the thermal expansion coefficients of the phosphor layer 1B and ferroelectric multi-layered film 2B after the cooling, as shown in FIG. 3(b). Typically, as the thermal expansion coefficient of the phosphor layer is higher than that of the ferroelectric multi-layered film, the amount of shrinkage of the phosphor layer 1B is larger than that of the ferroelectric multi-layered film 2B during the cooling step. The device is thus warped so that the ferroelectric multi-layered film 2B is protruded.

Figure 3C:
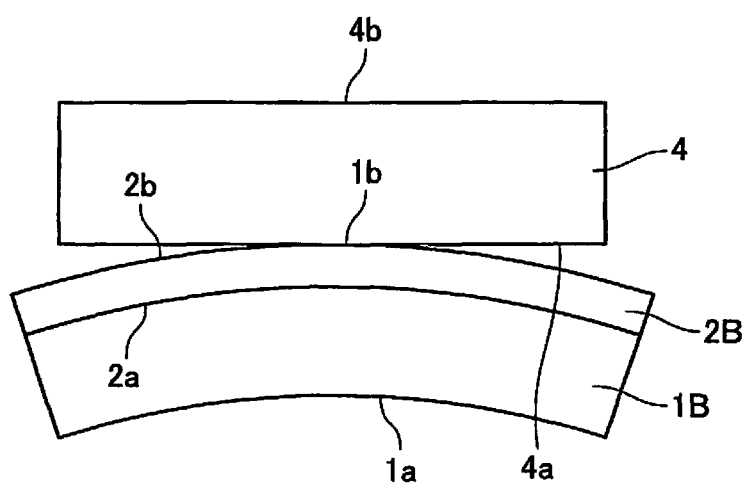
FIG. 3(c) shows the state that a phosphor layer 1B with a ferroelectric multi-layered film 2B provided is bonded to a supporting body 4.

By this, as shown in FIG. 3(c), when the phosphor layer 1B and the bonding surface 4a of the supporting body 4 are bonded by direct bonding, it may be difficult to perform the direct bonding over the whole surface of the supporting body due to the warping. As a result, the bubbles may be generated at the bonding surface of the supporting body. When the direct bonding is completed, it had been found that the conversion efficiency is deteriorated and the intensity of the fluorescence is lowered due to the effect of the internal stress remaining in the phosphor layer 4. It is generally known that the trapping by lattice defects lowers the conversion efficiency. Recently, it has been proved that, as the YAG single crystal is ground, defect levels may be generated on the surfaces of the particles due to the processing that lower the conversion efficiency. It is thus considered that, when internal stress is generated in the phosphor layer, micro cracks may be generated due to the internal stress to lower the conversion efficiency.

Figure 4A:
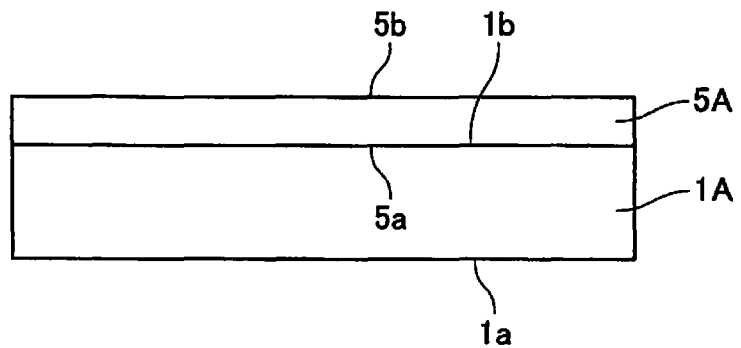
FIG. 4(a) shows the state that a metal film 5A is formed on a phosphor layer 1A.
Figure 4B:
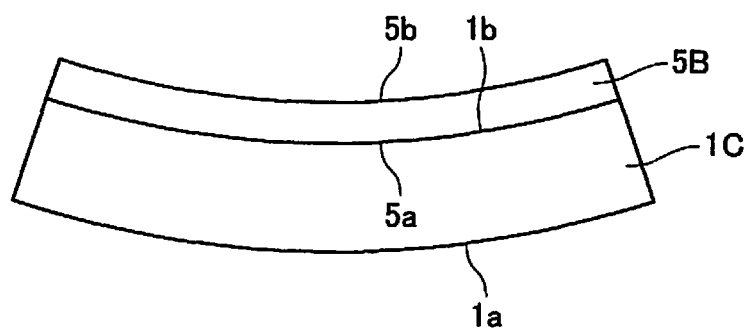
FIG. 4(b) shows the state after the phosphor layer of FIG. 4(a) is cooled.

Further, when the reflective film is the metal film, the metal film 5A is formed only on the first main surface 1b of the phosphor layer 1A, as shown in FIG. 4(a). Even when the laminate is flat during the film-formation step (at a high temperature) as shown in FIG. 4(a), warping occurred due to the difference of the thermal expansion coefficients of the phosphor layer 1C and metal film 5B after the cooling, as shown in FIG. 4(b). Typically, when thermal expansion coefficient of the phosphor layer is lower than that of the metal film, the amount of shrinkage of the phosphor layer 1C is smaller than that of the metal film 5B during the cooling step. The device is thus warped so that the surface of the metal film 5B is recessed.

Figure 4C:
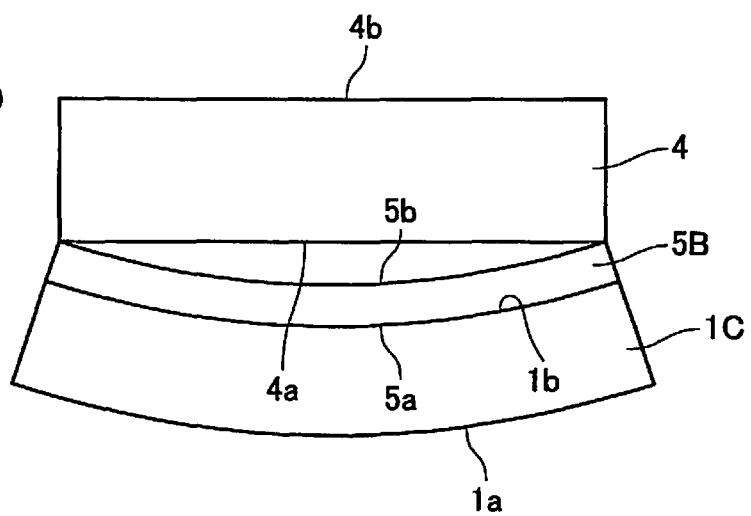
FIG. 4(c) shows the state that a phosphor layer 1C with a metal film 5B formed thereon is bonded to the supporting body 4.

By this, as shown in FIG. 4(c), when the phosphor layer 1C and the bonding surface 4a of the supporting body 4 are bonded by direct bonding, it may be difficult to complete the direct bonding uniformly over the whole surface of the supporting body due to the warping. As a result, the bubbles may be generated at the bonding surface of the supporting body. When the direct bonding is completed, it has been found that the conversion efficiency is deteriorated and the intensity of the fluorescence is lowered due to the effect of the internal stress remained in the phosphor layer 4.

The present inventors then tried to form the reflective film on the phosphor layer and the warping suppression layer on the reflective film so that the warping of the phosphor layer is reduced and the phosphor layer is bonded to the supporting body by direct bonding. As a result, it has been found that the bonding to the bonding surface of the supporting body is formed uniformly, the generation of bubbles can be suppressed, the deterioration of the conversion efficiency due to stress can be prevented and the intensity of the fluorescence reflected by the device is improved.

Figure 5A:
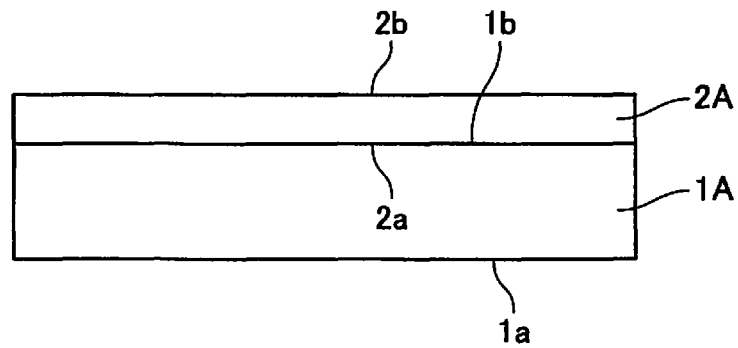
FIG. 5(a) shows the state that a ferroelectric multi-layered film 2A is formed on the phosphor layer 1A.
Figure 5B:
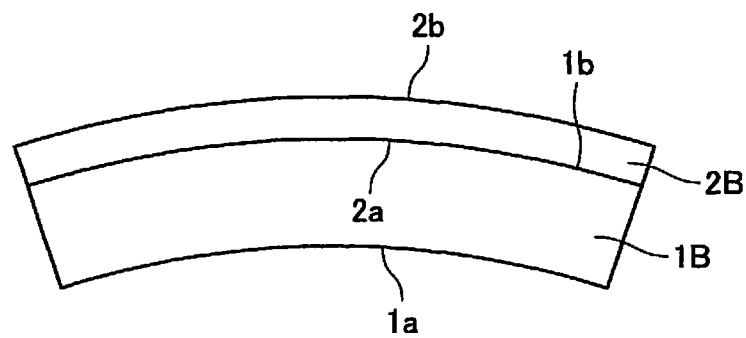
FIG. 5(b) shows the state after the phosphor layer of FIG. 5(a) is cooled.
Figure 5C:
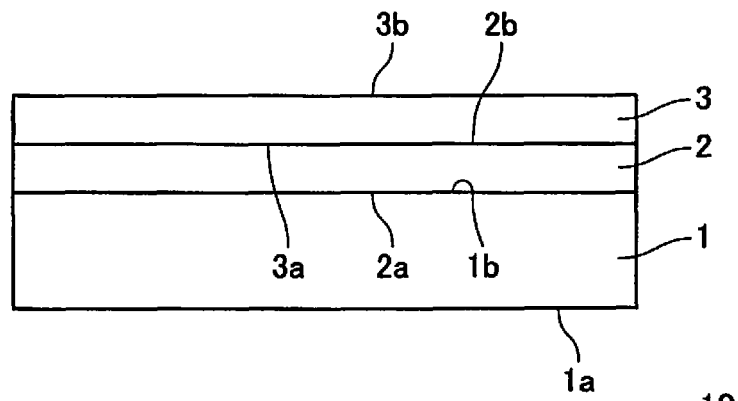
FIG. 5(c) shows the state that a warping suppression layer 3 is provided on the ferroelectric multi-layered film 2.
Figure 5D:
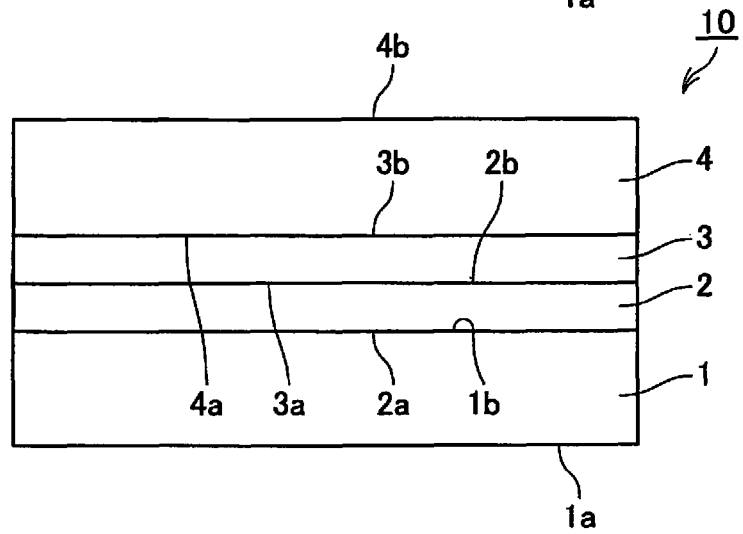
FIG. 5(d) shows the state that a warping suppression layer 4 is bonded to the supporting body 1 by direct bonding.

That is, when the reflective film is the ferroelectric multi-layered film as described above, after the cooling step, warping occurred due to the difference of the thermal expansion coefficients of the phosphor layer 1B and ferro-electric multi-layered film 2B, as shown in FIG. 5(b). Then, according to the present invention, when the warping suppression layer 3 is formed on the main surface 2b of the ferroelectric multi-layered film 2B, the warping of the ferroelectric multi-layered film 2 and phosphor layer 1 are suppressed as shown in FIG. 5(c), so that the flatness of the main surface 3b of the warping suppression layer 3 is improved. At this state, when the warping suppression layer 3 is bonded to the supporting body 4 by direct bonding as shown in FIG. 5(d), it has been found that the bubbles at the bonding surface of the supporting body can be suppressed and the intensity of the fluorescence reflected by the device is improved, as described above.

Figure 6A:
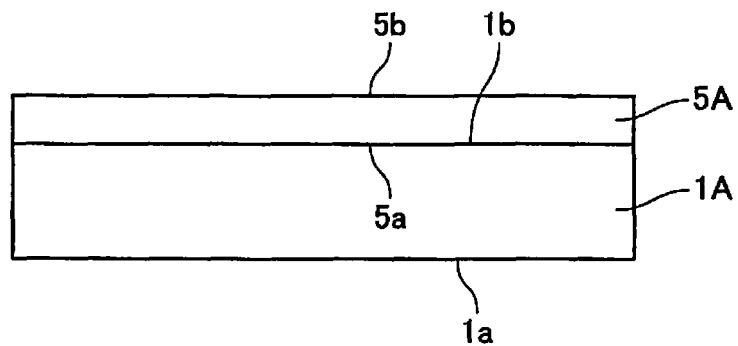
FIG. 6(a) shows the state that a metal film 5A is formed on the phosphor layer 1A.
Figure 6B:
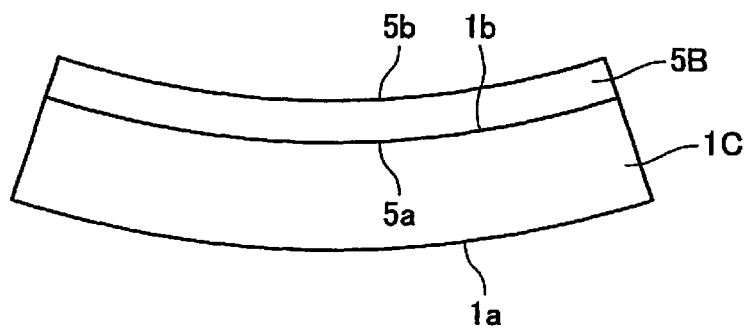
FIG. 6(b) shows the state after the phosphor layer of FIG. 6(a) is cooled.
Figure 6C:
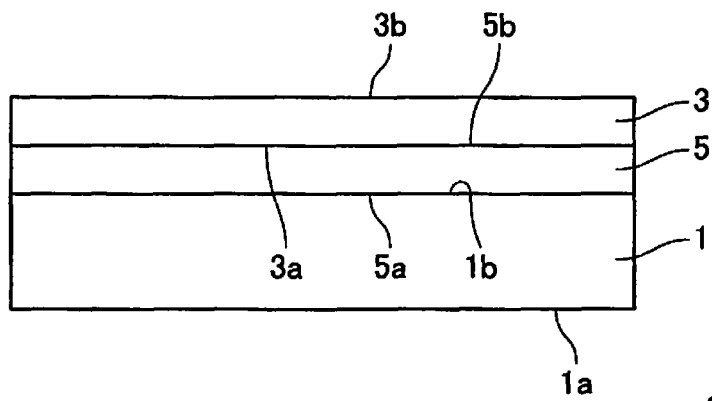
FIG. 6(c) shows the state that the warping suppression layer 3 is provided on the metal film 5.
Figure 6D:
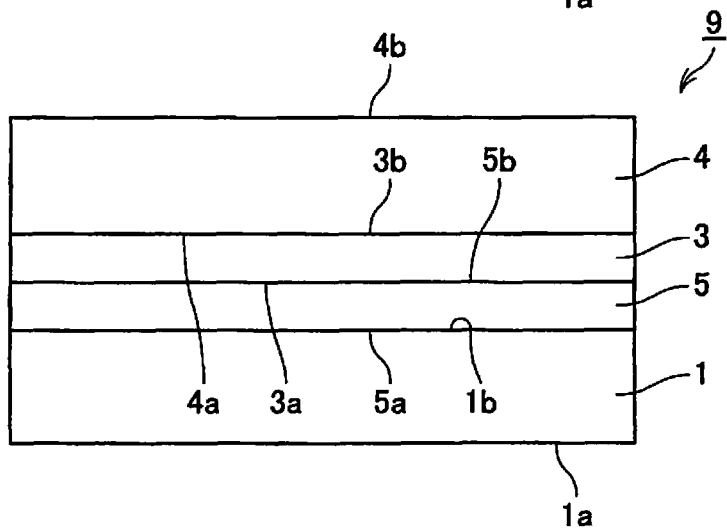
FIG. 6(d) shows the state that the warping suppression layer 4 is bonded to the supporting body 1 by direct bonding.

Further, when the reflective film is the metal film, as described above, after the cooling step, warping occurred due to the difference of the thermal expansion coefficients of the phosphor layer 1C and metal film 5B, as shown in FIG. 6(b). Then, according to the present invention, when the warping suppression layer 3 is formed on the main surface 5b of the metal film 5B, the warping of the metal film 5 and phosphor layer 1 are suppressed as shown in FIG. 5(c), so that the flatness of the main surface 3b of the warping suppression layer 3 is improved. At this state, when the warping suppression layer 3 is bonded to the supporting body 4 by direct bonding as shown in FIG. 5(d), it has been found that the bubbles at the bonding surface of the supporting body can be suppressed and the intensity of the fluorescence reflected by the device is improved.

According to a preferred embodiment, a partial transmission film transmitting a part of the excitation light on the phosphor layer on the opposite side of the reflective film is provided. By providing the transmission film, the excitation light is thus made incident onto the phosphor layer after passing through the partial transmission film.

That is, according to a device 20 shown in FIG. 7, the ferroelectric multi-layered film 2 or metal film 5 is provided on the main surface 1b of the phosphor layer 1, and the warping suppression layer 3 is provided on the main surface 2b (5b) of the ferroelectric multi-layered film 2 (metal film 5). A partial transmission film 15 is provided on the main surface 1a of the phosphor layer 1 on the opposite side to the ferroelectric multi-layered film 2. The main surface 3b of the warping suppression layer 3 is bonded to the main surface 4a of the supporting body 4 by direct bonding.

The excitation light A is incident onto the main surface 15a of the partial transmission film 15. A part of the excitation light is reflected at the partial transmission film and the remaining part of the light is incident onto the main surface 1a of the phosphor layer 1. The excitation light A incident onto the phosphor layer 1 is reflected by the ferroelectric multi-layered film 2 (metal film 5) as shown by an arrow C, and then reflected at the main surface 15b of the partial transmission film 15 as shown by an arrow D. The excitation light A propagates in the phosphor layer 1 and is gradually converted to fluorescence while it is repeatedly subjected to multiple reflection as shown by arrows C and D. The remaining excitation light and fluorescence pass through the phosphor layer 1 again as shown by an arrow B, emitted from the main surface 1a of the phosphor layer, transmit through the partial transmission film 15 and emitted to the outside of the device as shown by the arrow B.

The partial transmission film is a film through which a part of the excitation light is transmitted and at which the remaining part of the excitation light is reflected. Multiple reflection occurs between the incident surface of the excitation light and the opposite surface of the phosphor layer. By this, even when there is in-plane distribution of the conversion efficiency due to the uniformity of the phosphor forming the phosphor layer, the in-plane distribution of the luminance of the flux of the fluorescence can be made uniform as a whole, so that it is possible to obtain white light without color distribution suitable for illumination.

Further, the reflective film may be provided on the first main surface and the partial transmission film may be provided on the second main surface of the phosphor layer, so that both of the stresses can be cancelled to a some extent and the warping of the phosphor layer can be reduced. The warping suppression layer is further formed so that an uniform direct bonding interface can be obtained.

Embodiments of the present invention will be described in detail below.

Although the phosphor forming the phosphor layer is not limited as long as it can convert the excitation light into the fluorescence, the phosphor may be a phosphor glass, a phosphor single crystal or a phosphor polycrystal.

The phosphor glass is constructed by diffusing rare earth ions in a glass serving as a base.

As the glass serving as the base, an oxide glass containing silica, boron oxide, calcium oxide, lanthanum oxide, barium oxide, zinc oxide, phosphorus oxide, aluminum fluoride, magnesium fluoride, calcium fluoride, strontium fluoride, or barium chloride may be listed.

Although the rare earth ions diffused in the phosphor glass are preferably Tb, Eu, Ce, and Nd, the rare earth ions may be La, Pr, Sc, Sm, Er, Tm, Dy, Gd, or Lu.

As the phosphor single crystal, $Y_3Al_5O_{12}$, $Ba_5Si_{11}Al_7N_{25}$, and $Tb_3Al_5O_{12}$ are preferable. A part of Y (yttrium) sites of $Y_3Al_5O_{12}$ may be replaced with Lu. Further, a dopant doped in the phosphor single crystal may preferably be a rare earth ion and more preferably be Tb, Eu, Ce or Nd, although the dopant includes La, Pr, Sc, Sm, Er, Tm, Dy, Gd, or Lu.

As the polycrystalline phosphor, TAG (terbium aluminum garnet) series, sialon series, BOS (barium orthosilicate) series and YAG (yttrium aluminum garnet) are listed. A part of Y (yttrium) sites of YAG may be replaced with Lu.

A dopant doped into the polycrystalline phosphor may preferably be a rare earth ion and more preferably be Tb, Eu, Ce or Nd, although the dopant includes La, Pr, Sc, Sm, Er, Tm, Dy, Gd, or Lu.

The thickness of the phosphor layer may preferably be 30 µm or larger and more preferably be 50 µm or larger, on the viewpoint of converting the excitation light into the fluorescence at a sufficiently high efficiency. Further, when the thickness of the phosphor layer is too large, the excitation light or fluorescence is scattered at the side surface of the substrate or emitted, resulting in the attenuation. The thickness of the phosphor layer may thus preferably be 300 µm or smaller and more preferably be 250 µm or smaller.

The thickness of the phosphor layer means a dimension of the phosphor layer in a direction perpendicular to the bonding surface of the supporting body.

The reflective film provided on the phosphor layer is not particularly limited, as long as it can reflect the fluorescence passing through the phosphor layer. It is not necessary that the reflective film reflects the excitation light by total reflection and the reflective film may transmit a part of the excitation light.

According to a preferred embodiment, the reflective film is a metal film or a ferroelectric multi-layered film.

When the reflective film is the metal film, it is possible to reflect in a wide wavelength range, to reduce the dependency on the incident angle and to improve the resistances against temperature and weather. Further, when the reflective film is the ferroelectric multi-layered film, it is possible to avoid the absorption and to reflect 100 percent of the incident light to obtain the reflected light without a loss.

The reflectivity of the excitation light by the reflective film is 90 percent or higher and may preferably be 95 percent or higher. The excitation light may be subjected to total reflection.

The ferroelectric multi-layered film is formed by alternately laminating a low refractive index material and high refractive index material. The high refractive index material includes $TiO_2$, $Ta_2O_5$, $Ta_2O_3$, ZnO, $Si_3N_4$ and $Nb_2O_5$. Further, the low refractive index material includes $SiO_2$, $MgF_2$ and $CaF_2$.

The number of layers and total thickness of the ferroelectric multi-layered film is appropriately selected depending on the wavelength of the fluorescence to be reflected.

Further, the material of the metal film may preferably be the following.
(i) A single layered film of Al, Ag, Au etc.
(ii) A multi-layered film of Al, Ag, Au etc.

For the adhesion of the reflective film and phosphor substrate, prevention of separation, and prevention of ion migration, a buffer layer made of Cr, Ni, Ti, Pt or the like between the metal film and phosphor layer may be provided.

Although the thickness of the metal film is not particularly limited as long as it can reflect the fluorescence, the thickness of the metal film may preferably be 0.05 µm or larger and more preferably be 0.1 µm or larger.

The method of forming the ferroelectric multi-layered film, metal film, and warping suppression layer is not particularly limited and includes a vapor deposition method, sputtering method, and CVD method. In the case of the vapor deposition method, an ion assist may be added to perform the film formation.

The material of the supporting body may preferably be a material having a large thermal conduction and by which a high surface flatness can be easily realized. From this viewpoint, the material of the supporting body may preferably be alumina, aluminum nitride, silicon carbide, silicon or sapphire.

The partial transmission film is a film which reflects a part of the excitation light and transmits the remaining part of the light. Specifically, the reflectivity of the partial transmission film to the excitation light may preferably be 9 percent or higher and more preferably be 50 percent or higher.

The material of the partial transmission film includes the metal film or ferroelectric multi-layered film for the reflective film as described above. Further, for transmitting a part of the excitation light, the thickness of the metal film may preferably be made smaller and, specifically, may preferably be made 0.1 µm or smaller. Further, the number of the layers of the ferroelectric multi-layered film may preferably be made smaller and, specifically, may preferably be made 10 or smaller.

According to a preferred embodiment, for suppressing the lowering of conversion efficiency due to the warping after the bonding with the phosphor, the thermal expansion coefficient of the material of the supporting body may preferably be 50 to 150, provided that 100 is assigned to the thermal expansion coefficient of the material of the phosphor layer. From this viewpoint, the material of the supporting body may preferably be alumina, aluminum nitride or sapphire.

The thickness of the supporting body may preferably be 200 μm or larger, from the viewpoint of heat dissipation. Further, the thickness of the supporting body may preferably be 1000 μm or smaller, on the vipewpoint of the size reduction of the device.

As the material of the warping suppression layer provided on the reflective film, a material for suppressing the warping after the reflective film is formed on the phosphor layer is selected.

According to a preferred embodiment, the reflective film is the ferroelectric multi-layered film, and the thermal expansion coefficient of the material of the warping suppression layer is larger than the thermal expansion coefficient of material whose thermal expansion coefficient is the largest among the materials forming the ferroelectric multi-layered film.

In this case, the thermal expansion coefficient of the warping suppression layer may preferably be 150 to 600 and more preferably be 250 to 500, provided that 100 is assigned to the thermal expansion coefficient of the material having the maximum thermal expansion coefficient among the materials forming the ferroelectric multi-layered film.

Further, according to a preferred embodiment, the reflective film is a metal film, and the thermal expansion coefficient of the warping suppression layer is smaller than that of the material forming the metal film.

In this case, provided that 100 is assigned to the thermal expansion coefficient of the material of the metal film, the thermal expansion coefficient of the material of the warping suppression layer may preferably be 25 to 70 and more preferably be 30 to 50.

The thermal expansion coefficient referred to in the specification is defined as a linear thermal expansion coefficient in a direction of the plane of the substrate surface at 25° C.

Further, the thermal expansion coefficient of the warping suppression layer may be made smaller than the thermal expansion coefficient of the phosphor layer, so that the effect of the suppression of the warping can be made more considerable.

Further, according to a preferred embodiment, the thermal expansion coefficient of the warping suppression layer is between the thermal expansion coefficient of the phosphor layer and thermal expansion coefficient of the reflective film.

Further, according to a preferred embodiment, provided that 100 is assigned to the thermal expansion coefficient of the material of the phosphor layer, the thermal expansion coefficient of the warping suppression layer is 50 to 150. It is thus possible to suppress the warping of the phsophor layer easily. From this viewpoint, provided that 100 is assigned to the thermal expansion coefficient of the material of the phsophor layer, the thermal expansion coefficient of the warping suppression layer may preferably be 75 to 125.

The thermal expansion coefficients of preferred materials are shown below.

TABLE 1

| | Material | Thermal expansion coefficient ×10⁻⁶/K |
|---|---|---|
| Phosphor layer | YAG | 8 |
| Reflective film (Metal) | Al | 23.2 |
| | Ag | 19.0 |
| | Au | 14.2 |
| Reflective film (Ferroelectric multi-layered film) | TiO2 | 2.1 |
| | SiO2 | 0.7 |

TABLE 1-continued

| | Material | Thermal expansion coefficient ×10⁻⁶/K |
|---|---|---|
| Warping suppression layer | Al2O3 | 7.2 |
| | SiC | 4.4 |
| | Zr2O | 10.5 |
| | AlN | 4.6 |
| | Nb | 7.0 |
| | Ta | 6.3 |
| | Mo | 5.3 |
| | W | 4.5 |

According to the present invention, the supporting body is bonded to the warping suppression layer by direct bonding.

Although the direct bonding is generally categorized into metal/covalent bonding and diffusion bonding, it is targeted the metal/covalent bonding performing surface activation treatment in high vacuum. Further, according to the present invention, on the viewpoint of preventing contamination of atoms different from atoms constituting the clad layer and supporting body into the bonding interface, surface activation bonding is preferred.

Surface activation bonding will be described below. Argon ions are irradiated onto a high flatness substrate to remove impurity atoms on the surface to leave dangling bonds. The state is a well activated surface state, so that it is possible to bond with an object to be bonded at ambient temperature. Different kinds of materials can be thereby bonded. Further, an amorphous layer may be left along the bonding interface.

Further, atomic diffusion bonding means that a metal film, such as Ti for example, is formed on the supporting body and that the bonding is then performed. When surface activation bonding, it is possible to perform the bonding at a low temperature from an ambient temperature and not higher than 400° C. However, crystallized metal oxide is left and an amorphous layer is not generated. Thus, the thermal expansion at the bonding interface may result in a thermal stress, which is problematic.

According to the present embodiment, the method of irradiating argon ions is modified so that it is possible to prevent the contamination from a metal material forming a vacuum chamber at the interface, and to prevent the contamination from atoms other than those constituting the warping suppression layer and supporting body into the amorphous layer. The effect of relaxing the stress can be thus improved.

Further, the time period of the irradiation of the argon ions is controlled so that it is possible to control the thickness of the amorphous layer.

A semiconductor laser made of a GaN material high in reliability for exciting the phosphor for illumination is preferable as the light source. Moreover, a light source such as a laser array arranged in a one-dimensional form can be realized. The light source may be a super luminescent diode or a semiconductor optical amplifier (SOA). An LED may be further applied, or an excitation light from a light source may be made incident onto the phosphor device through an optical fiber.

Though a method of generating the white light from the semiconductor laser and the phosphor is not particularly limited, but the following methods are conceivable.

A method of generating a yellow fluorescence beam by a blue laser and a phosphor, thereby acquiring a white light.

A method of generating red and green fluorescence beams by a blue laser and a phosphor, thereby acquiring a white light.

A method of generating red, blue, and green fluorescence beams from a blue laser or an ultraviolet laser by a phosphor, thereby acquiring a white light.

A method of generating blue and yellow fluorescence beams from a blue laser or an ultraviolet laser by a phosphor, thereby acquiring a white light.

Moreover, respective end surfaces of the light source element and the phosphor device may be obliquely cut so as to suppress an end surface reflection. The bonding between the phosphor device and the supporting body may be an adhesion fixation or a direct bonding. The phosphor element may be formed on the supporting body by a film forming method such as sputtering and CVD.

EXAMPLES

Example 1: Case that the Reflective Film is a Multi-Layered Film

A phosphor device 10 shown in FIG. 1 was produced through procedures as shown in FIG. 5.

Specifically, a ferroelectric multi-layered film 2B was formed on a phosphor layer 1A made of a monocrystalline Ce-doped YAG (yttrium aluminum garnet) by an ion assisted vapor deposition system. The ferroelectric multi-layered film 2B is composed of low refractive index layers and high refractive index layers alternately laminated. The low refractive index layers are made of $SiO_2$, high refractive index layers are made of $TiO_2$, and a total number of the layers of the low and high refractive index layers is 69. Further, the total thickness of the low refractive index layers is 3.3 μm, the total thickness of the high refractive index layers is 1.8 μm, and the total thickness of the ferroelectric multi-layered film is 5 μm. In this ferroelectric multi-layered film, when the incident angle of the excitation light is 45°, the reflectivity at a wavelength of 450 nm was higher than 99.5 percent and the reflectivity at an wavelength of 580 nm was 98 percent.

In the above case, the thermal expansion coefficients of $SiO_2$ and $TiO_2$ forming the ferroelectric multi-layered film are $0.7 \times 10^{-6}$/K and $2.1 \times 10^{-6}$/K, which are lower than the thermal expansion coefficient of the monocrystalline YAG phosphor layer of $8 \times 10^{-6}$/K. A compression stress was thus applied on the phosphor layer after the vapor deposition, so that warping of larger than 100 μm was generated in the phosphor device of φ 3 inches.

The warping suppression layer 3 made of $Al_2O_3$ was then formed by sputtering. The thermal expansion coefficient of $Al_2O_3$ is higher than that of $TiO_2$, whose thermal expansion coefficient is higher in the two kinds of the ferroelectric material forming the ferroelectric multi-layered film. The thermal expansion coefficient of $Al_2O_3$ was $7.2 \times 10^{-6}$/K and the thickness was 2 μm. As a result, the warping of the phosphor layer was lowered to 10 μm or less.

The supporting body of sapphire and the warping suppression layer on the phosphor layer were then bonded by direct bonding (surface activation method) at ambient temperature. As a result of observing the bonding interface with a microscope, bubbles were not present at the bonding interface of the direct bonding. Thereafter, the thus bonded phosphor layer was subjected to optical polishing to a thickness of 100 μm. The deviation of the thickness of the phosphor layer was within ±0.25 μm.

Finally, the bonded body was cut into a size of 5×5 mm by a dicing system to produce reflection type phosphor devices. A semiconductor blue laser of 30 mW was projected onto the thus obtained phosphor device in a direction inclined by 45° with respect to the phosphor. The internal quantum efficiency at this time was proved to be higher than 90 percent. Further, a deviation of color tones was not observed.

Comparative Example 1: Case that the Reflective Film is a Ferroelectric Multi-Layered Film The phosphor device was produced according to the procedures shown in FIG. 3.

As in the Example 1, the ferroelectric multi-layered film 2B was formed on the phosphor layer made of a monocrystalline Ce-doped YAG (yttrium aluminum garnet) by an ion assisted vapor deposition system. A compression stress was thus applied on the phosphor layer after the vapor deposition, so that warping of larger than 100 μm was generated in the phosphor layer of φ 3 inches.

The supporting body 4 made of sapphire and the warping suppression layer 2B were then bonded by direct bonding (surface activation method) at an ambient temperature. As a result of observing the bonding interface with a microscope, many bubbles were observed at the bonding interface of the direct bonding.

Thereafter, the thus bonded phosphor layer was subjected to optical polishing to a thickness of 100 μm. The deviation of the thickness of the phosphor layer was proved to be ±5 μm.

Finally, the bonded body was cut into a size of 5×5 mm by a dicing system to produce reflection type phosphor devices. A semiconductor blue laser of 30 mW was projected onto the thus obtained phosphor device in a direction inclined by 45° with respect to the phosphor layer. The internal quantum efficiency at this time was higher than 80 percent. A deviation of color tones was also observed.

Example 2: Case that the Reflective Film is a Metal Film

A phosphor device 9 shown in FIG. 2 was produced through procedures as shown in FIG. 6.

Specifically, a metal film (aluminum film) 5B was formed on a phosphor layer made of a monocrystalline Ce-doped YAG (yttrium aluminum garnet) by a sputtering system in a thickness of 2 μm. The aluminum film has reflectivities of 91 percent at a wavelength of 450 nm and of 91 percent at a wavelength of 580 nm. In the above case, the thermal expansion coefficients of the monocrystalline YAG phosphor layer and of the aluminum film were $8 \times 10^{-6}$/K and $23.2 \times 10^{-6}$/K, respectively. A compression stress was thus applied on the substrate device after the sputtering, so that warping of larger than 100 μm was generated in the phosphor layer of φ 3 inches.

The warping suppression layer 3 made of $Al_2O_3$ was then formed by sputtering. The thermal expansion coefficient of $Al_2O_3$ is lower than that of the aluminum film. The thermal expansion coefficient of $Al_2O_3$ was $7.2 \times 10^{-6}$/K and the thickness was 2 μm. As a result, the warping of the phosphor layer was lowered to 10 μm or less.

The supporting body 4 made of sapphire and the warping suppression layer 3 were then bonded by direct bonding (surface activation method) at an ambient temperature. As a result of observing the bonding interface with a microscope, bubbles were not present at the bonding interface of the direct bonding. Thereafter, the thus bonded phosphor layer was subjected to optical polishing to a thickness of 100 μm. The deviation of the thickness of the phosphor layer was within ±0.25 μm.

Finally, the bonded body was cut into a size of 5×5 mm by a dicing system to produce reflection type phosphor devices. A semiconductor blue laser of 30 mW was projected onto the thus obtained phosphor device in a direction inclined by 45° with respect to the phosphor layer. The internal quantum efficiency at this time higher than 90 percent. Further, a deviation of color tones was not observed.

Comparative Example 2: Case that the Reflective Film is a Metal Film

The phosphor device was produced according to the procedures shown in FIG. 4.

As in the Example 2, the metal film was formed on the phosphor layer made of a monocrystalline Ce-doped YAG (yttrium aluminum garnet) by an ion assisted vapor deposition system. A compression stress was thus applied on the phosphor layer after the vapor deposition, so warping of larger than 100 μm was generated in the phosphor substrate of φ 3 inches.

The body made of sapphire and the phosphor substrate were then bonded by direct bonding (surface activation method) at an ambient temperature. As a result of observing the bonding interface with a microscope, many bubbles were observed at the boding interface of the direct bonding. Thereafter, the thus bonded phosphor layer was subjected to optical polishing to a thickness of 100 μm. The deviation of the thickness of the phosphor layer was ±5 μm.

Finally, the bonded body was cut into a size of 5×5 mm by a dicing system to produce reflection type phosphor devices. A semiconductor blue laser of 30 mW was projected onto the thus obtained phosphor device in a direction inclined by 45° with respect to the phosphor layer. The internal quantum efficiency at this time was higher than 80 percent. A deviation of color tones was observed.

Example 3: Case that the Reflective Film is a Ferroelectric Multi-Layered Film and that a Partial Transmission Film is Present on the Opposite Side of the Reflective Film A phosphor device 20 shown in FIG. 7 was produced through procedures as in the Example 1.

However, the thickness of the phosphor layer 1 was made 50 μm and the deviation of thickness of the phosphor layer 1 was within ±0.25 nm. A partial transmission film 15 was formed on a polished main surface 1a of the phosphor layer. The partial transmission film was formed of a ferroelectric multi-layered film. Specifically, the low refractive index layers were made of $SiO_2$, high refractive index layers were made of $TiO_2$, and a total number of the layers of the low and high refractive index layers was 5. In this ferroelectric multi-layered film, the reflectivity was 20 percent or higher in a wavelength range of 430 nm to 470 nm, and the reflectivity was 40 percent when the wavelength was 450 nm.

Finally, the bonded body was cut into a size of 5×5 mm by a dicing system to produce reflection type phosphor devices. A semiconductor blue laser of 30 mW was projected onto the thus obtained phosphor device in a direction inclined by 45° with respect to the phosphor layer. The internal quantum efficiency at this time higher than 90 percent. Further, a deviation of color tones was not observed.

What is claimed is:

1. A phosphor device comprising:
    a phosphor layer;
    a reflective film provided on said phosphor layer, said reflective film comprising a ferroelectric multi-layered film;
    a warping suppression layer provided on and directly contacting said reflective film, said warping suppression layer comprising a material selected from $Al_2O_3$, SiC, $ZrO_2$, AlN, Nb, Ta, Mo and W; and
    a supporting body bonded to said warping suppression layer by direct bonding, wherein
    a thermal expansion coefficient of a material of said warping suppression layer is larger than the largest thermal expansion coefficients of materials forming said ferroelectric multi-layered film,
    an excitation light incident onto said phosphor layer is converted to a fluorescence, and
    said fluorescence and said excitation light are reflected by said reflective film and emitted from said phosphor layer.

2. The device of claim 1, wherein said phosphor layer comprises a phosphor glass or a phosphor single crystal.

3. The device of claim 1, further comprising a partial transmission film partially transmitting said excitation light and provided on said phosphor layer on a side opposite to said reflective film, wherein said excitation light is incident into said phosphor layer after said excitation light passes through said partial transmission film.

4. The device of claim 1, wherein said warping suppression layer has a thermal expansion coefficient of from 50% to 150% of that of a thermal expansion coefficient of a material of said phosphor layer.

5. A lighting apparatus comprising a light source oscillating an excitation light and a phosphor device, wherein said phosphor device comprises said phosphor device of claim 1.

* * * * *